United States Patent
Park

(10) Patent No.: US 8,514,647 B2
(45) Date of Patent: Aug. 20, 2013

(54) REFRESH CIRCUIT

(75) Inventor: Sang Il Park, Suwon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 202 days.

(21) Appl. No.: 13/191,687

(22) Filed: Jul. 27, 2011

(65) Prior Publication Data

US 2012/0195150 A1    Aug. 2, 2012

(30) Foreign Application Priority Data

Jan. 27, 2011    (KR) .................. 10-2011-0008320

(51) Int. Cl.
 *G11C 7/00*    (2006.01)
(52) U.S. Cl.
 USPC ..................... 365/222; 365/230.03
(58) Field of Classification Search
 USPC ................. 365/222, 230.03, 189.05
 See application file for complete search history.

(56) References Cited

U.S. PATENT DOCUMENTS

| | | | |
|---|---|---|---|
| 4,807,196 A | 2/1989 | Mizukami | |
| 7,180,816 B2 | 2/2007 | Park | |
| 2003/0168685 A1* | 9/2003 | Sakata et al. | 257/296 |
| 2005/0152200 A1* | 7/2005 | Lee et al. | 365/222 |
| 2011/0032785 A1* | 2/2011 | Cho | 365/230.06 |

FOREIGN PATENT DOCUMENTS

| | | |
|---|---|---|
| KR | 1020020052934 A | 7/2002 |
| KR | 1020070069878 A | 7/2007 |
| KR | 100772110 B1 | 10/2007 |
| KR | 1020070105500 A | 10/2007 |

* cited by examiner

*Primary Examiner* — Vu Le

(74) *Attorney, Agent, or Firm* — William Park & Associates Patent Ltd.

(57) ABSTRACT

A refresh circuit includes an enable pulse generator configured to generate a first enable pulse and a second enable pulse, a first address latch configured to latch the first row address in synchronization with the first enable pulse and generate a first latch address, and a second address latch configured to latch a second row address in synchronization with the second enable pulse and generate second and third latch addresses.

18 Claims, 6 Drawing Sheets

REFRESH CIRCUIT

CROSS-REFERENCES TO RELATED APPLICATIONS

The present application claims priority under 35 U.S.C 119(a) to Korean Application No. 10-2011-0008320, filed on Jan. 27, 2011, in the Korean intellectual property Office, which is incorporated herein by reference in its entirety.

BACKGROUND

Recently, as the demand for mobile products such as a mobile phone terminal and a personal digital assistant (PDA) rapidly increases, a variety of attempts to reduce the current consumption of a semiconductor memory device mounted in such mobile products are continuously being made. In particular, to reduce a refresh current of a semiconductor memory device for mobile products is becoming a large issue.

Among semiconductor memory devices, Dynamic Random Access Memory (DRAM) stores information in memory cells by charging capacitors of the memory cells, different from Static Random Access Memory (SRAM) or flash memory. Since capacitors of the DRAM leak charge, the information eventually fades unless the capacitor charge is refreshed periodically. Such an operation is referred to as a refresh operation. The refresh operation is performed by activating memory cell arrays included in the semiconductor memory device at least one time within a retention time and amplifying data stored therein. Here, the retention time refers to a time during which data can be maintained without a refresh operation after the data are recorded in memory cells.

In general, a semiconductor memory device includes a plurality of banks, and memory cell arrays included in each of the banks are grouped as a plurality of mats. For example, if a 512M semiconductor memory device includes eight banks, each of the banks includes 64M memory cell arrays. Also, if memory cell arrays included in each of the banks are grouped as 32 mats, each of the mats includes 2M memory cell arrays. Further, for example, each of the mats includes 512 row lines. Specifically, each of the mats includes 64 main word lines, each of which has eight sub-word lines.

A refresh operation of a semiconductor memory device may be performed by activating the mats and simultaneously activating specific main word lines and specific sub word lines included in the activated mats. That is, the refresh operation may be performed by activating all main word lines and all sub word lines according to a sequence in which first main word lines and first sub word lines of all the mats are activated, and second main word lines and second sub word lines of all the mats are then activated, for example.

In the refresh operation performed in such a manner, all the mats are sequentially activated in a state in which the addresses of the main word lines and the sub word lines to be activated are fixed. Therefore, until counting all bits of row addresses for activating mats is terminated, row addresses for activating the main word lines and the sub word lines are not counted. Accordingly, a constant value is maintained.

However, row addresses are latched in synchronization with a pulse signal toggling during a refresh operation period. Therefore, even in a state in which the row addresses for activating the main word lines and the sub word lines are not counted and thus a constant value is maintained, the row addresses are continuously latched in synchronization with the pulse signal. Therefore, power consumption occurs.

SUMMARY

Embodiments of the present invention are directed to a refresh circuit which does not unnecessarily latch row addresses maintaining a constant level, thereby reducing current consumed during a refresh operation.

In one embodiment, a refresh circuit includes: an enable pulse generator configured to generate a first enable pulse including a pulse which is periodically generated during a refresh period and a second enable pulse including a pulse which is generated at a time point where counting all bits of a first row address is terminated; a first address latch configured to latch the first row address in synchronization with the first enable pulse and generate a first latch address; and a second address latch configured to latch a second row address in synchronization with the second enable pulse and generate second and third latch addresses.

In another embodiment, a refresh circuit includes: a first address latch configured to latch a first row address in response to a first enable pulse including a pulse which is periodically generated during a refresh period and generate a first latch address; a second address latch configured to latch a second row address in response to a second enable pulse including a pulse which is generated at a time point where counting all bits of the first row address is terminated, and generate second and third latch addresses; a first address decoder configured to generate a mat selection signal by decoding the first latch address; and a second address decoder configured to generate a main word line selection signal by decoding the second latch address and generate a sub word line selection signal by decoding the third latch address.

In another embodiment, a refresh circuit includes: a first address latch configured to latch a first row address in response to a first enable pulse including a pulse which is periodically generated during a refresh period, and generate a first latch address; a second address latch configured to latch a second row address in response to a second enable pulse including a pulse which is generated at a time point where counting all bits of the first row address is terminated, and generate second and third latch addresses; a first address decoder configured to generate a main word line signal by decoding the first latch address; and a second address decoder configured to generate a mat selection signal by decoding the second latch address and generate a sub word line selection signal by decoding the third latch address.

In another embodiment, a refresh circuit includes: a first address latch configured to latch a first row address in response to a first enable pulse including a pulse which is periodically generated during a refresh period, and generate a first latch address; a second address latch configured to latch a second row address in response to a second enable pulse including a pulse which is generated at a time point where counting all bits of the first row address is terminated, and generate second and third latch addresses; a first address decoder configured to generate a sub word line signal by decoding the first latch address; and a second address decoder configured to generate a main word line selection signal by decoding the second latch address and generate a mat selection signal by decoding the third latch address.

BRIEF DESCRIPTION OF THE DRAWINGS

The above and other aspects, features and other advantages will be more clearly understood from the following detailed description taken in conjunction with the accompanying drawings, in which.

DESCRIPTION OF SPECIFIC EMBODIMENTS

Hereinafter, embodiments of the present invention will be described in detail with reference to the accompanying drawings.

Figure 1:
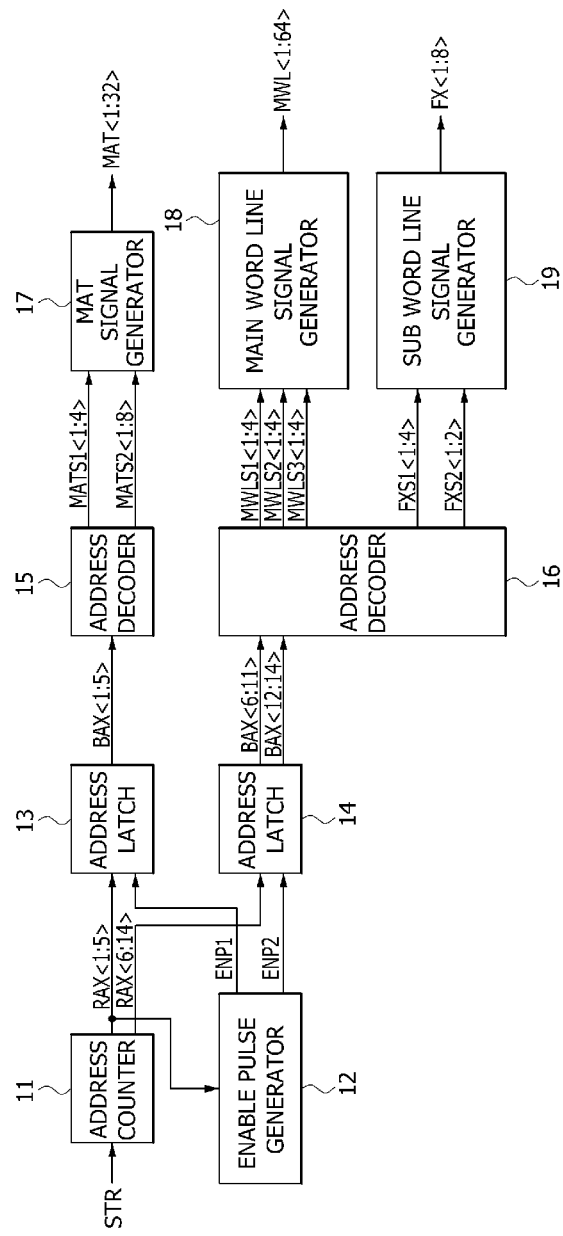
FIG. 1 is a block diagram illustrating an exemplary configuration of a refresh circuit in accordance with an embodiment of the present invention.

FIG. 1 is a block diagram illustrating an exemplary configuration of a refresh circuit in accordance with an embodiment of the present invention.

Referring to FIG. 1, the refresh circuit in accordance with the embodiment of the present invention includes an address counter 11, an enable pulse generator 12, a first address latch 13, a second address latch 14, a first address decoder 15, a second address decoder 16, a mat signal generator 17, a main word line signal generator 18, and a sub word line signal generator 19.

The address counter 11 is configured to count a 5-bit first row address RAX<1:5> and a 9-bit second row address RAX<6:14> when a start signal STR is enabled. The detailed configuration of the address counter will be described below with reference to FIG. 2.

The enable pulse generator 12 is configured to generate a first enable pulse ENP1 including a pulse which is periodically generated during a refresh period and a second enable pulse ENP2 including a pulse which is generated at a time point where counting all bits of the first row address RAX<1:5> is terminated. The detailed configuration of the enable pulse generator 12 will be described below with reference to FIG. 3.

The first address latch 13 is configured to latch the first row address RAX<1:5> at a time point where the pulse of the first enable pulse ENP1 is inputted, and output a 5-bit first latch address BAX<1:5>. The second address latch 14 is configured to latch the second row address RAX<6:14> at a time point where the pulse of the second enable pulse ENP2 is inputted, and output a second latch address BAX<6:11> and a third latch address BAX<12:14>.

The first address decoder 15 is configured to decode the first latch address BAX<1:5> and generate a 4-bit first mat selection signal MATS1<1:4> and an 8-bit second mat selection signal MATS2<1:8>. The second address decoder 16 generates main word line selection signals MWLS1<1:4>, MWLS2<1:4> and MWLS3<1:4> and sub word line selection signals FXS1<1:4> and FXS2<1:2> in response to latch addresses BAX<6:11> and BAX<12:14>. According to an example, the second address decoder 16 is configured to decode the second latch address BAX<6:11> and generate a first main word line selection signal MWLS1<1:4>, a second main word line selection signal MWLS2<1:4>, and a third main word line selection signal MWLS3<1:4>, each of which includes four bits. Furthermore, the second address decoder 16 is configured to decode the third latch address BAX<12:14> and generate a 4-bit first sub word line selection signal FXS1<1:4> and a 2-bit second sub word line selection signal FXS2<1:2>.

The mat signal generator 17 is configured to generate first to 32nd mat signals MAT<1:32> which are selectively enabled according to a combination of the first mat selection signal MATS1<1:4> and the second mat selection signal MATS2<1:8>. The main word line signal generator 18 is configured to generate first to 64th main word line signals MWL<1:64> which are selectively enabled according to a combination of the first main word line selection signal MWLS1<1:4>, the second main word line selection signal MWLS2<1:4>, and the third main word line selection signal MWLS3<1:4>. The sub word line signal generator 19 is configured to generate first to eighth sub word line signals FX<1:8> which are selectively enabled according to a combination of the first sub word line selection signal FXS1<1:4> and the second sub word line selection signal FXS2<1:2>.

Figure 2:
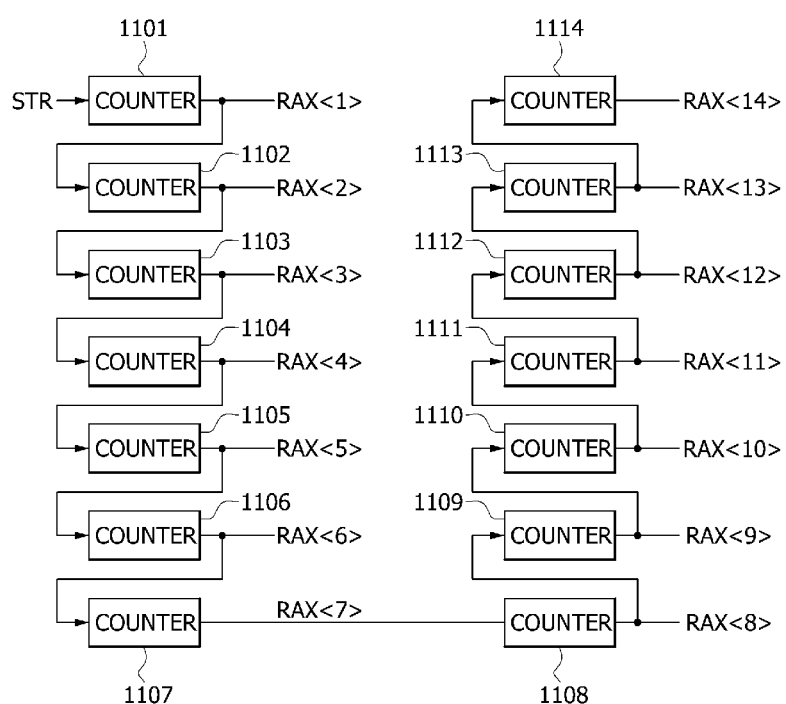
FIG. 2 is a block diagram illustrating an exemplary configuration of an address counter included in the refresh circuit of FIG. 1.

Referring to FIG. 2, the address counter 11 includes first to 14th counters 1101 to 1114 to count the first row address RAX<1:5> and the second row address RAX<6:14>, which are initially all reset to a logic low level, one bit by one bit until all the bits of the first row address RAX<1:5> and the second row address RAX<6:14> become a logic high level. According to an example, the first row address RAX<1:5> includes lower bits, and the second row address RAX<6:14> includes upper bits. Therefore, whenever all the bits of the first row address RAX<1:5> are counted as a logic high level, the second row address RAX<6:14> is up-counted by one bit. The first counter 1101 is driven by the start signal STR which is enabled to a logic high level by a self-refresh command or auto-refresh command.

Figure 3:
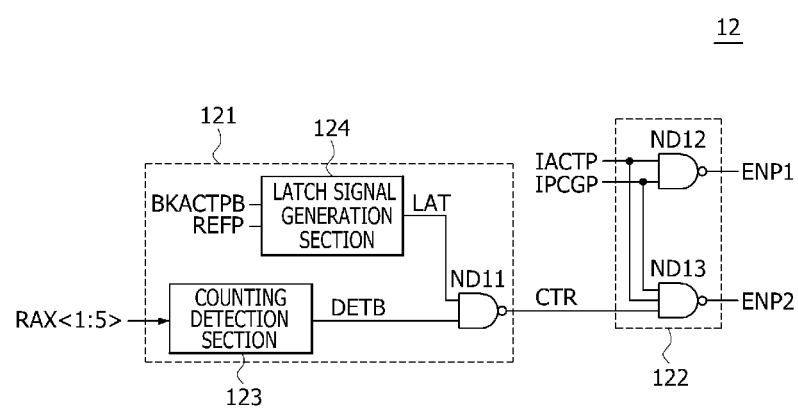
FIG. 3 is a block diagram illustrating an exemplary configuration of an enable pulse generator included in the refresh circuit of FIG. 1.

Referring to FIG. 3, the enable pulse generator 12 includes a control signal generation unit 121 and an enable pulse output unit 122. The control signal generation unit 121 includes a counting detection section 123, a latch signal generation section 124, and a NAND gate ND11. The counting detection section 123 is configured to generate a detection signal DETB which is enabled to a logic low level when the first row address RAX<1:5> of which all the bits are high levels is inputted. The latch signal generation section 124 is configured to receive a bank active pulse BKACTPB and a refresh pulse REFP and generate a latch signal LAT which maintains a logic high level during a refresh period. The NAND gate ND11 is configured to generate a control signal CTR which is enabled to a logic high level when the detection signal DETB is enabled to a logic low level in a state in which the latch signal LAT of a logic high level is inputted during the refresh period. The enable pulse output unit 122 includes NAND gates ND12 and ND13. The enable pulse output unit 122 is configured to generate a first enable pulse ENP1 including a pulse which is periodically generated according to an internal active pulse IACTP and an internal precharge pulse IPCGP. Furthermore, the enable pulse output unit 122 generates a second enable pulse ENP2 of a logic high level when a control signal CTR disabled to a logic low level is inputted, and generates a second enable pulse ENP2 including a pulse which is generated according to the internal active pulse IACTP and the internal precharge pulse IPCGP when a control signal CTR enabled to a logic high level is inputted. The bank active pulse BKACTPB, the refresh pulse REFP, the internal active pulse IACTP, and the internal precharge pulse IPCGP are pulse signals including a pulse having preset intervals during a refresh period.

Figure 4:
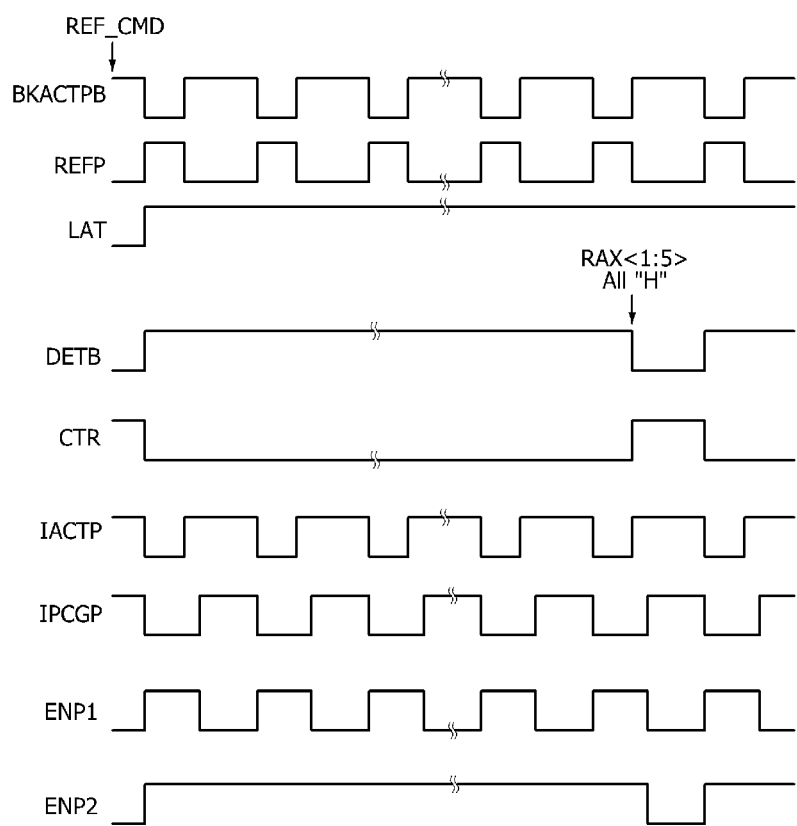
FIG. 4 is a timing diagram explaining a refresh operation of the refresh circuit of FIG. 1.

The above-described refresh circuit may include a plurality of banks, each of which has 64 mats, and each of the mats may be applied to a semiconductor memory device including 512 row lines. The numbers of mats, main word lines, and sub word lines may be set in various manners according to embodiments. Hereinafter, referring to FIG. 4, the operation of the enable pulse generator 12 illustrated in FIG. 3 will be described specifically as follows.

When the start signal STR which is enabled to a logic high level by the refresh command REF_CMD including a self-refresh command or auto-refresh command is inputted, the address counter 11 counts the first row address RAX<1:5> and the second row address RAX<6:14>, of which all bits are initially reset to a logic low level, one bit by one bit until all the bits of the first row address RAX<1:5> and the second row address RAX<6:14> become a logic high level.

Here, the latch signal LAT is generated to a logic high level by the bank active pulse BKACTPB and the refresh pulse REFP during the refresh period, and the detection signal DETB is enabled to a logic low level during a certain period from a time point where all bits of the first row address RAX<1:5> become logic high levels. The control signal CTR is enabled to a logic high level by the latch signal LAT and the detection signal DETB generated in such a manner, during a period where the detection signal DETB is enabled to a logic low level. Therefore, the second enable pulse ENP2 generated by the enable pulse generator 12 includes a pulse which is generated in synchronization with the internal active pulse IACTP and the internal precharge pulse IPCGP at a time point where counting all bits of the first row address RAX<1:5> is terminated. Meanwhile, the first enable pulse ENP1 includes a pulse which is generated at preset intervals during the refresh period, in synchronization with the internal active pulse IACTP and the internal precharge pulse IPCGP.

According to the second enable pulse ENP2 generated by the above-described enable pulse generator 12, the second address latch 14 latches the second row address RAX <6:14> only when counting all bits of the first row address RAX<1:5> is terminated, and outputs the second latch address BAX<6:11> and the third latch address BAX<12:14>. That is, when the second row address RAX<6:14> for activating the main word lines and the sub word lines is not counted and thus a constant value is maintained, the second address latch 14 does not latch the second row address latch RAX<6:14> and does not output the latch address BAX<6:11> and the third latch address BAX<12:14>. Therefore, when the refresh circuit in accordance with this embodiment is applied, it is possible to reduce unnecessary current consumption caused by latching the second row address RAX<6:14> maintaining a constant level.

Figure 5:
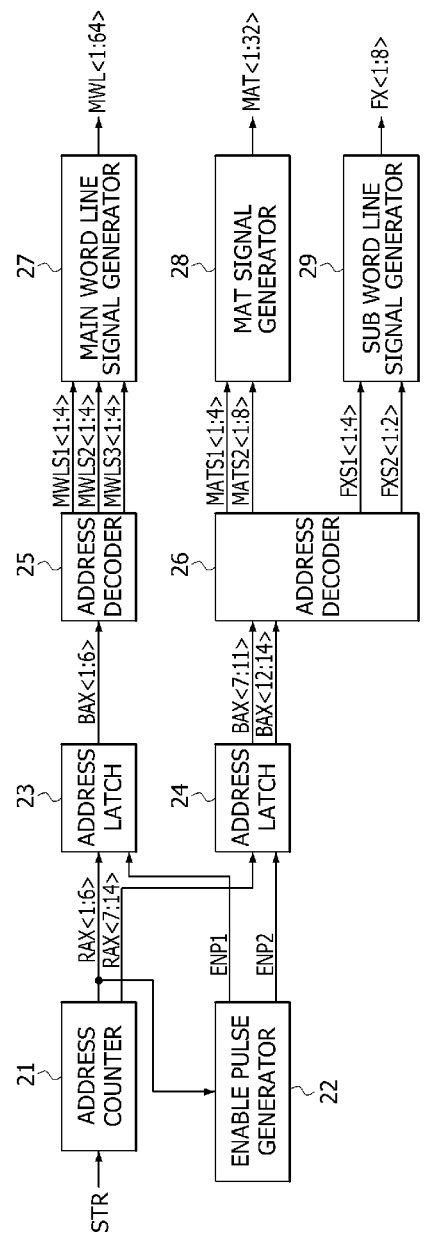
FIGS. 5 and 6 are block diagrams illustrating exemplary configurations of a refresh circuit in accordance with another embodiments of the present invention.

FIG. 5 is a block diagram an exemplary configuration of a refresh circuit in accordance with another embodiment of the present invention.

Referring to FIG. 5, the refresh circuit in accordance with the embodiment of the present invention includes an address counter 21, an enable pulse generator 22, a first address latch 23, a second address latch 24, a first address decoder 25, a second address decoder 26, a main word line signal generator 27, a mat signal generator 28, and a sub word line signal generator 29.

The address counter 21 is configured to count a 6-bit first row address RAX <1:6> and an 8-bit second row address RAX<7:14> when a start signal STR is enabled.

The enable pulse generator 22 is configured to generate a first enable pulse ENP1 including a pulse which is periodically generated during a refresh period and a second enable pulse ENP2 including a pulse which is generated at a time point where counting all bits of the first row address RAX<1:6> is terminated.

The first address latch 23 is configured to latch the first row address RAX<1:6> at a time point where the pulse of the first enable pulse ENP1 is inputted, and output a 6-bit first latch address BAX<1:6>. The second address latch 24 is configured to latch the second row address RAX<7:14> at a time point where the pulse of the second enable pulse ENP2 is inputted, and output a second latch address BAX<7:11> and a third latch address BAX<12:14>.

The first address decoder 25 is configured to decode the first latch address BAX<1:6> and generate a first main word line selection signal MWLS1<1:4>, a second main word line selection signal MWLS2<1:4>, and a third main word line selection signal MWLS3<1:4>, each of which includes four bits. The second address decoder 26 generates mat selection signals MATS1<1:4> and MATS2<1:8> and sub word line selection signals FXS1<1:4> and FXS2<1:2> in response to latch addresses BAX<7:11> and BAX<12:14>. According to an example, the second address decoder 26 is configured to decode the second latch address BAX<7:11> and generate a 4-bit first mat selection signal MATS1<1:4> and an 8-bit second mat selection signal MATS2<1:8>. Furthermore, the second address decoder 26 is configured to decode the third latch address BAX<12:14> and generate a 4-bit first sub word line selection signal FXS1<1:4> and a 2-bit second sub word line selection signal FXS2<1:2>.

The main word line signal generator 27 is configured to generate first to 64th main word line signals MWL<1:64> which are selectively enabled according to a combination of the first main word line selection signal MWLS1<1:4>, the second main word line selection signal MWLS2<1:4>, and the third main word line selection signal MWLS3<1:4>. The mat signal generator 28 is configured to generate first to 32nd mat signals MAT<1:32> which are selectively enabled according to a combination of the first mat selection signal MATS1<1:4> and the second mat selection signal MATS2<1:8>. The sub word line signal generator 29 is configured to generate first to eighth sub word line signals FX<1:8> which are selectively enabled according to a combination of the first sub word line selection signal FXS1<1:4> and the second sub word line selection signal FXS2<1:2>.

The refresh circuit configured in the above-described manner may be applied to a semiconductor memory device which performs a refresh operation by sequentially activating all main word lines in a state in which mats and sub word lines are fixed. When the second row address RAX<7:14> for activating the mats and the sub word lines is not counted and thus a constant value is maintained, the refresh circuit does not latch the second row address RAX<7:14>, and does not output the second latch address BAX<7:11> and the third latch address BAX<12:14>. Therefore, when the refresh circuit in accordance with the embodiment of the present invention is applied, it is possible to reduce unnecessary current consumption caused by latching the second row address RAX<7:14> maintaining a constant level.

Figure 6:
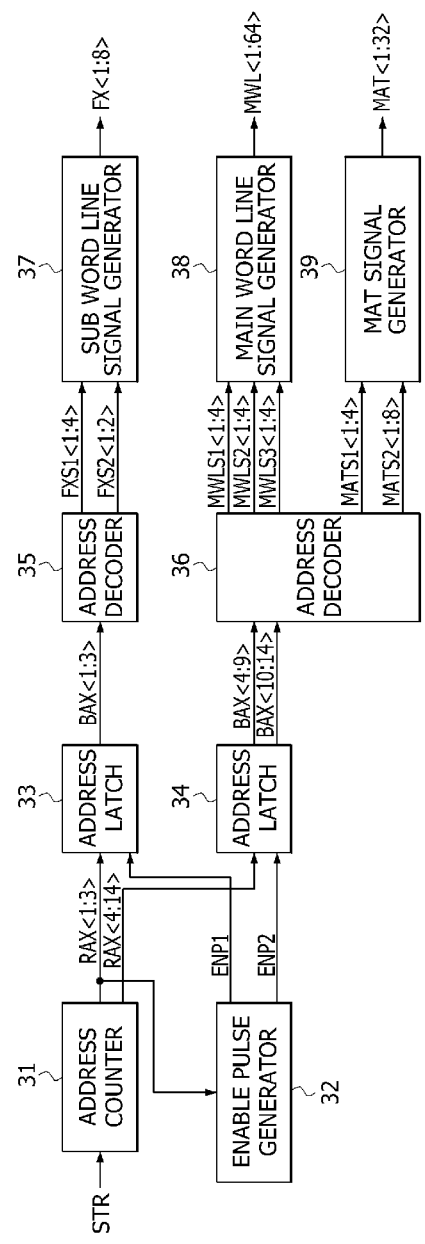

FIG. 6 is a block diagram illustrating an exemplary configuration of a refresh circuit in accordance with another embodiment of the present invention.

Referring to FIG. 6, the refresh circuit in accordance with the embodiment of the present invention includes an address counter 31, an enable pulse generator 32, a first address latch 33, a second address latch 34, a first address decoder 35, a second address decoder 36, a sub word line signal generator 37, a main word line signal generator 38, and a mat signal generator 39.

The address counter 31 is configured to count a 3-bit first row address RAX<1:3> and an 11-bit second row address RAX<4:14> when a start signal STR is activated.

The enable pulse generator 32 is configured to generate a first enable pulse ENP1 including a pulse which is periodically generated during a refresh period and a second enable pulse ENP2 including a pulse which is generated at a time point where counting all bits of the first row address RAX<1:3> is terminated.

The first address latch 33 is configured to latch the first row address RAX<1:3> at a time point where the pulse of the first enable pulse ENP1 is inputted, and output a 3-bit first latch address BAX<1:3>. The second address latch 34 is configured to latch the second row address RAX<4:14> at a time point where the pulse of the second enable pulse ENP2 is inputted, and output a 6-bit second latch address BAX<4:9> and a 5-bit third latch address BAX<10:14>.

The first address decoder 35 is configured to decode the first latch address BAX<1:3> and generate a 4-bit first sub word line selection signal FXS1<1:4> and a two-bit second sub word line selection signal FXS2<1:2>. The second address decoder 36 generates main word line selection signals MWLS1<1:4>, MWLS2<1:4> and MWLS3<1:4> and sub word line selection signals FXS1<1:4> and FXS2<1:8> in response to latch addresses BAX<4:9> and BAX<10:14>. According to an example, the second address decoder 36 is configured to decode the second latch address BAX<4:9> and generate a first main word line selection signal MWLS1<1:4>, a second main word line selection signal MWLS2<1:4>, and a third main word line selection signal MWLS3<1:4>, each of which includes four bits. Furthermore, the second address decoder 36 is configured to decode the third latch address BAX<10:14> and generate a 4-bit first mat selection signal MATS1<1:4> and an 8-bit second mat selection signal FXS2<1:8>.

The sub word line signal generator 37 is configured to generate first to eighth sub word line signals FX<1:8> which are selectively enabled according to a combination of the first sub word line selection signal FXS1<1:4> and the second sub word line selection signal FXS2<1:4>. The main word line signal generator 38 is configured to generate first to 64th main word line signals MWL<1:64> which are selectively enabled according to a combination of the first main word line selection signal MWLS1<1:4>, the second main word line selection signal MWLS2<1:4>, and the third main word line selection signal MWLS3<1:4>. The mat signal generator 39 is configured to generate first to 32nd mat signals MAT<1:32> which are selectively enabled according to a combination of the first mat selection signal MATS1<1:4> and the second mat selection signal MATS2<1:8>.

The refresh circuit configured in the above-described manner may be applied to a semiconductor memory device which performs a refresh operation by sequentially activating all the sub word lines in a state in which the mats and the main word lines are fixed. When the second row address RAX<4:14> for activating the mats and the main word lines is not counted and thus a constant is maintained, the refresh circuit does not latch the second row address RAX<4:14>, and does not output the second latch address BAX<4:9> and the third latch address BAX<10:14>. Therefore, when the refresh circuit in accordance with the embodiment of the present invention is applied, it is possible to reduce unnecessary current consumption caused by latching the second row address RAX<4:14> maintaining a constant value.

The embodiments of the present invention have been disclosed above for illustrative purposes. Those skilled in the art will appreciate that various modifications, additions and substitutions are possible, without departing from the scope and spirit of the invention as disclosed in the accompanying claims.

What is claimed is:

1. A refresh circuit comprising:
an enable pulse generator configured to generate a first enable pulse including a pulse which is periodically generated during a refresh period and a second enable pulse including a pulse which is generated at a time point where counting all bits of a first row address is terminated;
a first address latch configured to latch the first row address in synchronization with the first enable pulse and generate a first latch address; and
a second address latch configured to latch a second row address in synchronization with the second enable pulse and generate second and third latch addresses.

2. The refresh circuit of claim 1, wherein the enable pulse generator comprises:
a control signal generation unit configured to generate a control signal which is enabled when the row address including a preset combination of bits is inputted; and
an enable pulse output unit configured to output the first and second enable pulses in response to the control signal, an internal active pulse, and an internal precharge pulse.

3. The refresh circuit of claim 2, wherein the control signal generation unit comprises:
a latch signal generation section configured to generate a latch signal in response to a bank active pulse generated to activate a bank and a refresh pulse generated during the refresh period;
a counting detection section configured to detect whether counting the bits included in the first row address is terminated or not, and generate a detection signal; and
a logic element configured to output the control signal in response to the latch signal and the detection signal.

4. The refresh circuit of claim 2, wherein the enable pulse output unit comprises:
a first logic element configured to generate the first enable pulse in response to the internal precharge pulse and the internal active pulse including a pulse which is periodically generated during the refresh period; and
a second logic element configured to generate the second enable pulse in response to the internal active pulse and the internal precharge pulse when the control signal is enabled.

5. The refresh circuit of claim 1, wherein the first address latch latches the first row address at a time point where the pulse of the first enable pulse is inputted, and outputs the latched first row address as the first latch address.

6. The refresh circuit of claim 1, wherein the second address latch latches the second row address at a time point where the pulse of the second enable pulse is inputted, and outputs the latched second row address as the second and third latch addresses.

7. The refresh circuit of claim 1, further comprising:
a first address decoder configured to generate a mat selection signal by decoding the first latch address; and
a second address decoder configured to generate a main word line selection signal by decoding the second latch address and generate a sub word line selection signal by decoding the third latch address.

8. The refresh circuit of claim 7, further comprising:
a mat signal generator configured to enable a mat signal for activating a mat in response to the mat selection signal;
a main word line signal generator configured to enable a main word line signal for activating a main word line in response to the main word line selection signal; and a sub word line signal generator configured to enable a sub word line signal for activating a sub word line in response to the sub word line selection signal.

9. The refresh circuit of claim 1, further comprising:
a first address decoder configured to generate a main word line selection signal by decoding the first latch address; and
a second address decoder configured to generate a mat selection signal by decoding the second latch address and generate a sub word line selection signal by decoding the third latch address.

10. The refresh circuit of claim 9, further comprising:
a main word line signal generator configured to enable a main word line signal for activating a main word line in response to the main word line selection signal;
a mat signal generator configured to enable a mat signal for activating a mat in response to the mat selection signal; and
a sub word line signal generator configured to enable a sub word line signal for activating a sub word line in response to the sub word line selection signal.

11. The refresh circuit of claim 1, further comprising:
a first address decoder configured to generate a sub word line selection signal by decoding the first latch address; and
a second address decoder configured to generate a main word line selection signal by decoding the second latch address and generate a mat selection signal by decoding the third latch address.

12. The refresh circuit of claim 11, further comprising:
a sub word line signal generator configured to enable a sub word line signal for activating a sub word line in response to the sub word line selection signal;
a main word line signal generator configured to enable a main word line signal for activating a main word line in response to the main word line selection signal; and
a mat signal generator configured to enable a mat signal for activating a mat in response to the mat selection signal.

13. A refresh circuit comprising:
a first address latch configured to latch a first row address in response to a first enable pulse including a pulse which is periodically generated during a refresh period and generate a first latch address;
a second address latch configured to latch a second row address in response to a second enable pulse including a pulse which is generated at a time point where counting all bits of the first row address is terminated, and generate second and third latch addresses;
a first address decoder configured to generate a mat selection signal by decoding the first latch address; and
a second address decoder configured to generate a main word line selection signal by decoding the second latch address and generate a sub word line selection signal by decoding the third latch address.

14. The refresh circuit of claim 13, further comprising:
a mat signal generator configured to enable a mat signal for activating a mat in response to the mat selection signal;

a main word line signal generator configured to enable a main word line signal for activating a main word line in response to the main word line selection signal; and
a sub word line signal generator configured to enable a sub word line signal for activating a sub word line in response to the sub word line selection signal.

15. A refresh circuit comprising:
a first address latch configured to latch a first row address in response to a first enable pulse including a pulse which is periodically generated during a refresh period, and generate a first latch address;
a second address latch configured to latch a second row address in response to a second enable pulse including a pulse which is generated at a time point where counting all bits of the first row address is terminated, and generate second and third latch addresses;
a first address decoder configured to generate a main word line signal by decoding the first latch address; and
a second address decoder configured to generate a mat selection signal by decoding the second latch address and generate a sub word line selection signal by decoding the third latch address.

16. The refresh circuit of claim 15, further comprising:
a main word line signal generator configured to enable a main word line signal for activating a main word line in response to the main word line selection signal;
a mat signal generator configured to enable a mat signal for activating a mat in response to the mat selection signal; and
a sub word line signal generator configured to enable a sub word line signal for activating a sub word line in response to the sub word line selection signal.

17. A refresh circuit comprising:
a first address latch configured to latch a first row address in response to a first enable pulse including a pulse which is periodically generated during a refresh period, and generate a first latch address;
a second address latch configured to latch a second row address in response to a second enable pulse including a pulse which is generated at a time point where counting all bits of the first row address is terminated, and generate second and third latch addresses;
a first address decoder configured to generate a sub word line signal by decoding the first latch address; and
a second address decoder configured to generate a main word line selection signal by decoding the second latch address and generate a mat selection signal by decoding the third latch address.

18. The refresh circuit of claim 17, further comprising:
a sub word line signal generator configured to enable a sub word line signal for activating a sub word line in response to the sub word line selection signal;
a main word line signal generator configured to enable a main word line signal for activating a main word line in response to the main word line selection signal; and
a mat signal generator configured to enable a mat signal for activating a mat in response to the mat selection signal.

* * * * *